(12) United States Patent
Burggraf

(10) Patent No.: US 9,929,124 B2
(45) Date of Patent: Mar. 27, 2018

(54) METHOD FOR BONDING SUBSTRATES

(71) Applicant: EV GROUP E. THALLNER GMBH, St. Florian am Inn (AT)

(72) Inventor: Jurgen Burggraf, Scharding (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/317,686

(22) PCT Filed: Jun. 26, 2014

(86) PCT No.: PCT/EP2014/063603
§ 371 (c)(1),
(2) Date: Dec. 9, 2016

(87) PCT Pub. No.: WO2015/197126
PCT Pub. Date: Dec. 30, 2015

(65) Prior Publication Data
US 2017/0117247 A1    Apr. 27, 2017

(51) Int. Cl.
*H01L 21/44* (2006.01)
*H01L 21/48* (2006.01)
(Continued)

(52) U.S. Cl.
CPC .............. *H01L 24/83* (2013.01); *C03C 27/10* (2013.01); *C09J 5/00* (2013.01); *C23C 14/5826* (2013.01); *H01L 24/03* (2013.01); *H01L 24/27* (2013.01); *H01L 24/29* (2013.01); *H01L 24/32* (2013.01); *H01L 24/743* (2013.01); *C09J 2400/143* (2013.01); *H01L 2224/038* (2013.01); *H01L 2224/04026* (2013.01); *H01L 2224/2731* (2013.01); *H01L 2224/27318* (2013.01); *H01L 2224/27416* (2013.01); *H01L 2224/27418* (2013.01); *H01L 2224/29015* (2013.01); *H01L 2224/29017* (2013.01);
(Continued)

(58) Field of Classification Search
CPC ................................ H01L 24/03; H01L 24/83
USPC .......................................................... 438/118
See application file for complete search history.

(56) References Cited

U.S. PATENT DOCUMENTS

| | | | |
|---|---|---|---|
| 2008/0216952 A1 | 9/2008 | Yu et al. | 156/272.2 |
| 2009/0183819 A1 | 7/2009 | Matsuhira | 156/99 |

(Continued)

FOREIGN PATENT DOCUMENTS

| | | | | |
|---|---|---|---|---|
| DE | 102013113241 A1 | 6/2015 | | B81C 1/00 |
| EP | 2695923 A2 | 2/2014 | | C09J 5/00 |

(Continued)

OTHER PUBLICATIONS

International Search Report from corresponding International Patent Application No. PCT/EP2014/063603, dated May 6, 2015.
(Continued)

*Primary Examiner* — David S Blum
(74) *Attorney, Agent, or Firm* — Kusner & Jaffe

(57) ABSTRACT

A method for bonding a first substrate with a second substrate by means of a connecting layer that is arranged between the substrates and that is comprised of a connecting material with the following steps: applying the connecting material to the first substrate and/or the second substrate in liquid form, and distributing the connecting material between the substrates by bringing the substrates closer and as a result forming the shape of the connecting layer with a thickness t.

6 Claims, 4 Drawing Sheets

(51) Int. Cl.
  *H01L 21/50* (2006.01)
  *H01L 23/00* (2006.01)
  *C03C 27/10* (2006.01)
  *C09J 5/00* (2006.01)
  *C23C 14/58* (2006.01)

(52) U.S. Cl.
  CPC ............ *H01L 2224/2919* (2013.01); *H01L 2224/2939* (2013.01); *H01L 2224/29294* (2013.01); *H01L 2224/32135* (2013.01); *H01L 2224/32145* (2013.01); *H01L 2224/32225* (2013.01); *H01L 2224/831* (2013.01); *H01L 2224/83022* (2013.01); *H01L 2224/83048* (2013.01); *H01L 2224/83102* (2013.01); *H01L 2224/83121* (2013.01); *H01L 2224/83143* (2013.01); *H01L 2224/83191* (2013.01); *H01L 2224/83193* (2013.01); *H01L 2224/83194* (2013.01); *H01L 2224/83862* (2013.01); *H01L 2224/83868* (2013.01); *H01L 2224/83871* (2013.01); *H01L 2224/83874* (2013.01)

(56) References Cited

U.S. PATENT DOCUMENTS

| 2011/0130065 A1 | 6/2011 | Andoh et al. ............... 445/24 |
| 2012/0021233 A1 | 1/2012 | Hayakawa et al. ........... 428/447 |

FOREIGN PATENT DOCUMENTS

| JP | 2000-191985 A | 7/2000 | ............ C09J 5/00 |
| JP | 2004-10810 A | 1/2004 | ............ C08G 59/42 |
| JP | 2004-325788 A | 11/2004 | ............ G02F 1/13 |
| JP | 2007-281392 A | 10/2007 | ............ H01L 21/60 |
| JP | 2009-289915 A | 12/2009 | ............ H01L 21/52 |
| JP | 2010-174077 A | 8/2010 | ............ C09J 163/00 |
| WO | WO 03/091784 A1 | 11/2003 | ............ G02B 27/28 |
| WO | WO 2011/140469 A1 | 11/2011 | ............ G01T 1/10 |
| WO | WO 2012/051003 A2 | 4/2012 | ............ H01L 21/58 |
| WO | WO 2013/016859 A1 | 2/2013 | ............ G02F 1/1333 |

OTHER PUBLICATIONS

Website print out of "True Zero Order Waverplate," web.archive.org/web/20131207092122 and redoptronics.com/true-zero-order-waverplate.html, print out date, Feb. 19, 2013.

Website print out of "True Zero-order Waverplates," web.archive.org/web/20131027032451 and optocity.com/waverplate-true-zero-order.htm, print out date, Feb. 22, 2013.

Shi et al., "Developement of the Wafer Level Compressive-Flow Underfill Process and Its Required Matierals," 1999 Electronic Components and Technology Conference, Jun. 1, 1999, pp. 961-966.

METHOD FOR BONDING SUBSTRATES

FIELD OF THE INVENTION

This invention relates to a method for bonding a first substrate with a second substrate.

BACKGROUND OF THE INVENTION

The state of the art showcases a wide variety of processes, technologies, and systems with whose help different surfaces, in particular connecting surfaces, can be coated with liquids, in particular mixtures of viscous polymers with solvents.

Adhesives represent an important group of liquids. Adhesives are used to an increasing extent in the semiconductor industry in order to connect substrates to one another. In this case, a distinction is made between the temporary adhesives and the permanent adhesives.

A temporary adhesive is in most cases a thermoplast, which softens above a characteristic temperature, the so-called glass transition temperature. Substrates that were glued with the help of a thermoplast can be separated from one another again by heating the thermoplast above the glass transition temperature. Thermoplasts can be thermally cycled; therefore, they can be theoretically heated several times and cooled again, without them losing their physical and/or chemical properties. The reason lies in the fact that in contrast to duromers, thermoplasts do not cross-link. As a result, the polymer chains can be moved toward one another at correspondingly high temperatures, and the temporary adhesive remains moldable.

Permanent adhesives are polymers whose polymer chains permanently cross-link to one another under chemical, thermal or electromagnetic action. The cross-linking process is irreversible. Such polymers are routinely used to connect substrates to one another, in particular substrates that are comprised of different materials.

The connection of two substrates can be performed by a wide variety of methods. Thus, for example, substrates with metal surfaces are connected to one another via a metal diffusion bond. The connection between silicon and/or silicon oxide surfaces is made by a so-called direct or fusion bond. Glass substrates can be connected to one another in particular also by anodic bonding if an ion transport that is required for this purpose is possible.

The above-mentioned connecting methods have the decisive drawback that they are limited to specific surface properties of the substrates. Thus, in most cases, only metal to metal surfaces can be connected by means of a metal diffusion bond. In addition, the direct or fusion bond technology can be used only between silicon and/or silicon oxide surfaces, or at least surfaces that have similar properties. For example, the bonding between a metal surface and a silicon surface in general is not possible by means of a diffusion bond or a direct bond. Therefore, such connections are mostly produced by means of permanent adhesives.

In principle, it is desired to minimize the thickness t of the permanent adhesive layer. On the one hand, the thickness t is to be large enough to connect the two substrates to one another securely and permanently, and preferably rough spots of the surface are to be compensated for. On the other hand, the thickness t should be as small as possible, however, in order not to impair the properties (for example, transparency, hardness, strength, rigidity, thermal conductivity) of the products that are produced.

The most important technique for applying adhesives is the centrifugal coating or centrifugal enameling. In the case of the centrifugal enameling, an amount of permanent adhesive is applied (i.e., dispensed) centrically on a substrate. In this case, the substrate is fixed to a specimen holder. After the application of the permanent adhesive, the specimen holder is set to rotating rapidly. Because of the centrifugal force, the permanent adhesive is distributed relatively uniformly over the substrate. The thickness t of the permanent adhesive can be set by the amount of deposition, the rotational speed, and the rotational acceleration.

Another coating technique is the spray coating or spray enameling. This is a technique in which a nozzle sprays a liquid that is to be applied while said nozzle performs a movement relative to a substrate. In the case of the relative movement between nozzle and substrates, this can be a simple rotation, a translation, or more complicated movements.

One of the greatest challenges in the connection of two substrates, which in most cases also still comprise different materials, is the production of a defect-free boundary layer. In the case of the direct connection of two substrates, in particular silicon-silicon or silicon oxide-silicon oxide, the focus is placed on the avoidance of inclusions and cavities. During direct bonding, the connecting surfaces of the two substrates are preferably centrically brought into contact with one another. Whereby a bonding wave proceeding from the center propagates radially outward. On the micro- and/or nano level, a distortion of one of the two connecting surfaces can occur. The distortion results in a bulging of at least one of the two connecting surfaces that remains permanently in the interface.

In contrast to the direct bonding method, the inclusion of gases, in particular the formation of bubbles, is the greatest problem in the case of the pet anent-adhesive-bonding method. The more highly viscous a liquid is, the more difficult it is for the gas inclusions to be able to escape from the liquid. An amount of gas, once trapped, can virtually no longer escape and remains in the interface.

Because of the coating methods used in the state of the art, the following problems arise.

The centrifugal enameling namely produces a relatively homogeneous and bubble-free layer on a substrate. However, the second substrate must be brought into contact with this already present permanent adhesive layer. Should the permanent adhesive layer have a high level of unevenness (roughness), inclusion of gas bubbles often results. In addition, all types of liquids, which are applied via centrifugal coating, form an edge bead at the edge of the substrates. Therefore, in the region of the edge bead, the permanent adhesive has a greater thickness than in the center. In this connection, gas inclusions often result. Most liquids applied by centrifugal enameling have such a high viscosity that they have to be diluted with a solvent. This solvent must be removed by a heat treatment process after the centrifugal enameling. Because of the outgassing of the solvent, the surface roughness increases, which in turn can lead to an inferior bonding result.

Even in the case of the spray coating, gas inclusions occur again and again, for example because of the roughness of the surfaces. This roughness is a direct result of the individual, agglomerating droplets on the surface of the substrate.

SUMMARY OF THE INVENTION

The object of this invention is therefore to indicate a method with which the bonding result is improved and which can be used universally.

This object is achieved with the features of the independent claim(s). Advantageous further developments of the invention are indicated in the subclaims. All combinations of at least two of the features indicated in the specification, the claims and/or the figures also fall within the scope of the invention. In the indicated ranges of values, values as boundary values that lie within the above-mentioned limits are also to be considered as disclosed and can be claimed in any combination.

The basic idea of this invention is to apply a connecting material as a liquid, in particular a polymer, even more preferably a permanent adhesive, between two substrates, in such a way that the liquid is distributed at least partially, preferably predominantly, automatically, in particular exclusively by linear movement of one or two substrates toward one another, between the substrates, in particular by concentric or radially symmetric propagation. A central aspect according to the invention comprises in particular in applying the connecting material in an amount that is free of excess. The embodiment that is disclosed according to the invention is in particular self-regulating relative to A setting of the layer thickness and/or
A wedge error compensation, and/or
A liquid distribution.

Self-regulating means that no control is necessary for optimizing the above-mentioned parameters, in particular from the outside. A system according to the invention, once left to itself, strives for the state with a maximally homogeneous layer thickness, a minimum wedge error and/or an optimum liquid distribution, in particular by gravitational action on the upper substrate and/or by capillary action between the two substrates.

Free of excess means that the amount of the applied connecting material is sufficient to form the complete connecting layer with a preset thickness t, in particular without connecting material overflowing a peripheral edge of at least one of the substrates.

The applied amount is preferably applied on a surface B that is small compared to the connecting surface A of the substrates. The ratio of surface B to A is preferably less than ½, even more preferably less than ⅓, even more preferably less than ¼, and even more preferably less than ⅕.

The liquid is automatically distributed in particular by the force of weight of one of the two substrates (in particular the upper substrate) and/or by capillary action of the liquid between the two substrates. One of the two substrates is released in particular after the liquids are brought into contact (in the case of an application on the two substrates) or the liquid is brought into contact with one of the substrates.

From the above, with minimal effort and expenditure of energy, there follows a defect-free, efficient, and material-conserving distribution of the connecting material and design of a connecting layer that comprises the connecting material between two substrates. The liquid is distributed in such a way that a mean thickness t of the hardened connecting layer is defined, and because of the homogeneous, bubble-free distribution, the total thickness of the stack that comprises the first substrate, second substrate, and the connecting layer is constant over the surface. In particular, the formation of an edge bead is also prevented. When using transparent substrates and liquids that can be hardened by electromagnetic radiation, in particular permanent adhesives, the liquid can be directly hardened by means of irradiation, in particular by means of UV light.

For distribution of the connecting material, at least two substrates are used, whereby the connecting material is to remain for a certain time between the two substrates. According to the invention, temporary and permanent bonding methods are preferred.

The connecting material is in particular a permanent bonding adhesive. According to the invention, however, the use of a temporary adhesive, a photoresist, a liquid, which is converted into an insulating layer in a later process, or a purification liquid would be conceivable. As connecting material, in particular all types of mixtures are defined, preferably adhesives, which are dissolved in solvents.

According to the invention, the formation of defects, in particular the formation of bubbles, is also prevented in the case of connecting materials with high to very high viscosity. In addition, a liquid distribution with a very homogenous layer thickness t is achieved by the embodiment according to the invention.

The substrates can have any shape, but are preferably circular. In particular, the substrates according to the invention do not have any projections or edges that rise above the contact surfaces. The contact surface is designed as in particular completely flat. The diameter of the substrates is in particular industrially standardized. For wafers (preferred as substrates), in particular diameters of 1 inch, 2 inches, 3 inches, 4 inches, 5 inches, 6 inches, 8 inches, 12 inches and 18 inches are preferred. The embodiment according to the invention can in principle handle any substrate, however, independently of its diameter. The embodiment according to the invention is suitable in particular for the coating and the bonding of rectangular substrates, preferably glass substrates. In a first process step according to the invention, a defined amount of liquid of the connecting material is deposited or applied on the first substrate and/or the second substrate. The liquid is preferably deposited/applied centrically and forms a puddle or a drop. The application is done in particular in such a way that a smooth and clean liquid surface is produced, whereby in particular the material selection and/or additional process conditions such as temperature and pressure are taken into consideration according to the invention. An irregularity in the liquid surface can result in accidental inclusions.

In a special expansion according to the invention, the liquid is not applied as droplets but rather as a geometric pattern on the substrate surface. By the targeted deposition of a liquid pattern, the distribution of the liquid during the distribution process according to the invention can be influenced. This special expansion according to the invention has particular advantages for the uniform distribution of the liquid on non-circular, in particular rectangular, for example quadratic, substrates. Rectangular substrates do not have any radial symmetry. The path to the corner of such a rectangular substrate is therefore from the geometric mean of the substrate that is comprised of longer edges than the path to some of the edges. In general, the paths are therefore dependent upon the direction in which the liquid is distributed. Therefore, in order to distribute the liquid uniformly, in particular also at the same time, over the substrate surface, in particular more liquid is to be deposited according to the invention in the direction of longer paths.

According to an embodiment of the invention, in particular by depositing the liquid in the shape of a cross, whereby the top corners show the rectangular substrate in the corners, an initial situation can be created, which in the distribution of the liquid according to the invention leads to the fact that the liquid reaches each point of the rectangular substrate approximately simultaneously, and preferably exactly simultaneously. Analogous considerations apply for any shaped substrates, whereby the pattern of the liquid in each case is calculated individually for each form of substrate or is determined experimentally. In the most special expansions according to the invention, the pattern is to be comprised of lines and/or point combinations. In an especially special expansion according to the invention, the line thicknesses of the lines of the pattern are varied during the deposition. By the production of such a pattern, it can also be ensured that a contact wave of the process according to the invention begins to run from the correct contact point. By the production of such patterns, a faster and primarily more homogeneous coating is possible by the process according to the invention. On the substrate surface of the second substrate, in turn there can be a deposited drop that is brought into contact with the pattern on the substrate surface of the first substrate.

In particular, the amount of deposited/applied liquid is determined, in particular calculated, relative to the desired thickness t at the end of the method, i.e., in particular after the hardening of the liquid. Assuming a homogeneous distribution of the liquid between the substrates, a 100% incompressible liquid with constant density and a corresponding preset substrate surface, the amount of liquid to be deposited is calculated in particular as follows. The volume V of the connecting layer with the thickness t over the basic surface A (connecting surface of the first and/or second substrate) after the process according to the invention is concluded is:

$$V = t*A$$

In the case of circular substrates, the surface area A is equal to the square of the radius of the circle (or half the diameter) times the number π, i.e., $$V = t*r^2*\pi = t*\left(\frac{d}{2}\right)^2*\pi$$

In the case of an incompressible liquid, the volume is independent of the pressure. In particular, the amount of liquid of the connecting material is deposited/applied by a volume control, whereby in the case of the preset substrate surface area A and the desired or set layer thickness t, the amount of volume to be deposited is to be dispensed, in particular adjusted by a shrinkage caused by the hardening. The shrinkage, in which in particular a polymerization shrinkage is involved, is indicated by the shrinkage parameter s. A polymerization shrinkage is defined as the reduction of the volume or the compacting of a polymer by the advancing cross-linking of the polymer chains below one another. This irreversible process takes place primarily in the permanent bonding adhesives. Another reason for the reduction of the volume would be the outgassing of liquid components. In the embodiments according to the invention, outgassing of a liquid would be difficult or not possible at all, since the distributed liquid is located between two, in general gas-tight, substrates. The outgassing would be possible only via the relatively narrow area between the peripheral contours of the two substrates. Hereinafter, therefore, this type of shrinkage will not be discussed in any further detail. The shrinkage parameter s is defined as the difference of 1 and the ratio of the volume V after the shrinkage to volume $V_o$ before the shrinkage, therefore:

$$s = 1 - \frac{V}{V_0}$$

The shrinkage is less than 0.2, preferably less than 0.1, even more preferably less than 0.01, most preferably less than 0.001, and with the utmost preference 0.

As an alternative, the amount of liquid is deposited/applied in particular by a mass control system, whereby the calculated volume is multiplied with the (in particular constant) density of the connecting material.

$$m = p*V$$
$$= p*t*r^2*\pi$$
$$= p*t*\left(\frac{d}{2}\right)^2*\pi$$

In this case, according to the invention, care must be taken in particular that the density of the liquid is a function of temperature. A smallest possible thickness t of the connecting layer is preferably sought in order to optimize the transmission of electromagnetic radiation through the connecting layer, i.e., to reduce the absorption.

By way of example, but not in a limiting manner, the amount of liquid to be deposited for different layer thicknesses for a specified diameter of a substrate is presented in the form of a table. The density is in this case selected as 1 g/cm³, whereby this is a realistic value for the density of polymers according to the invention. The real density of a thermoplast, in particular a thermoplast that is dissolved in a solvent, can deviate therefrom.

Tabular depiction of a series of amounts of liquid to be deposited with volume V (or correspondingly converted mass m) for a 200 mm substrate and different thicknesses t.

| Radius r m | Surface Area A m² | Density ρ g/cm³ | Thickness t μm | Volume V m³ | Mass m kg |
|---|---|---|---|---|---|
| 0.1 | 0.031416 | 1 | 1 | 3.14159E−08 | 3.14159E−05 |
| 0.1 | 0.031416 | 1 | 2 | 6.28319E−08 | 6.28319E−05 |
| 0.1 | 0.031416 | 1 | 5 | 1.5708E−07 | 0.00015708 |
| 0.1 | 0.031416 | 1 | 10 | 3.14159E−07 | 0.000314159 |
| 0.1 | 0.031416 | 1 | 50 | 1.5708E−06 | 0.001570796 |
| 0.1 | 0.031416 | 1 | 100 | 3.14159E−06 | 0.003141593 |

The thickness t according to the invention of the connecting layer lies in particular between 100 μm and 0.001 μm, preferably between 75 μm and 0.01 μm, even more preferably between 50 μm and 0.1 μm, most preferably between 25 μm and 1 μm, and with the utmost preference between 10 μm and 1 μm.

In another, in particular second, process step, the approach of the two substrates toward one another is carried out. Before and/or during the approach, a wedge error compensation can be performed in particular between the substrates. The two substrates are preferably quickly brought closer up to a first position in order to accelerate the process sequence. In this approach process up to the first position, the relative speed of approach of the two substrates toward one another is in particular greater than 0.01 mm/s, preferably greater than 0.1 mm/s, even more preferably greater than 1 mm/s, and most preferably greater than 10 mm/s. The embodiment according to the invention has the advantage, however, that the correction of the wedge error can be completely eliminated in most cases. The wedge error is automatically compensated for completely or at least to a large extent by the self-distributing liquid between the two substrates.

The first position preferably ends with bringing the liquids into contact (with application on the two substrates) or bringing the liquid into contact with one of the two substrates.

The relative speed of approach is in particular reduced when reaching the first position and is in particular less than 1 mm/s, preferably less than 0.1 mm/s, even more preferably less than 0.01 mm/s, and most preferably less than 0.001 mm/s. In an especially preferred embodiment, the process according to the invention accordingly is performed in a previously-described two-stage process.

In another, in particular third, process step according to the invention, one of the substrates, in particular the second substrate, is detached from its securing device (receiving device). In the case of horizontal storage of the two substrates, gravitational force and capillary force, which acts via the liquid between the two substrates, pulls the upper substrate in the direction of the lower substrate. By the pressure distribution, thus produced, within the liquid, the liquid is automatically distributed along the boundary surface. The propagating liquid wave in this case pushes the air ahead of it and removes all types of gases from the substrate boundary surface. The distribution of the liquid is carried out in particular uniformly, even more preferably radially symmetrically, and preferably concentrically. In the case of corresponding storage and selection of a viscosity of the liquid, which is high enough to prevent the liquid from running from the substrate in the event that the substrates are positioned crosswise or vertically, a crosswise or vertical positioning of the substrates is also conceivable. In such a special embodiment according to the invention, exclusively the capillary action would ensure the automatic approach of the substrates toward one another as well as the liquid distribution between the substrates.

In another, in particular fourth, step according to the invention, the liquid reaches the edge of the two substrates, and, based on the preset amount and the lack of capillary action, the distribution is automatically ended. The liquid (connecting material) has in particular a viscosity that is low enough to be able to be distributed between the two substrates, but is high enough not to be able to leave the substrates held together by the surface tension present on the edge. The viscosity is a physical property, which is greatly temperature-dependent. The viscosity of liquids, in particular of polymers, in general decreases with increasing temperature. At room temperature, the viscosity of the connecting material according to the invention is in particular between $10^6$ Pa*s and 1 Pa*s, preferably between $10^5$ Pa*s and 1 Pa*s, even more preferably between $10^4$ Pa*s and 1 Pa*s, and most preferably between $10^3$ Pa*s and 1 Pa*s.

The processes according to the invention work in principle with any hydrophilicity values of the substrate surfaces. The hydrophilicity values of the substrate surfaces can, in particular by using different substrate materials and/or different surface treatment processes, also be different. If a rough distinction is thus made between hydrophobic and hydrophilic, in principle the following combinations for the first and second substrates are possible:

Hydrophobic-hydrophobic
Hydrophilic-hydrophilic
Hydrophobic-hydrophilic
Hydrophilic-hydrophobic Hydrophilic substrate surfaces are used according to the invention primarily when a corresponding wetting and thus a higher contact surface and a correspondingly higher adhesive strength between the liquid and the substrate surface are to be produced. In particular, substrates, on whose bottom side liquids in the form of a drop should be deposited, have a correspondingly high hydrophilicity.

According to the invention, however, hydrophobic surfaces are used primarily for producing a point contact between a deposited liquid and the substrate surface. Such point contacts can be used primarily in those embodiments according to the invention in which the liquid is deposited only at the hydrophilic bottom side of the upper substrate, while the top side of the hydrophobic lower substrate when making contact makes only point contact with the convex drop. The force of the weight of the upper substrate then spreads the droplets between the two substrate surfaces starting from this point-like contact.

The hydrophilicity is determined using the contact angle method. In this case, the angle between the tangent to a liquid drop and the wetted surface is measured using an optical device. The method is known to one skilled in the art. The measured angle is acute in the case of higher hydrophilicity and obtuse in the case of higher hydrophobicity. For hydrophilic substrate surfaces according to the invention, the preferred contact angle between the liquid connecting material and the connecting surfaces (contact surfaces) is in particular less than 90°, preferably less than 70°, even more preferably less than 50°, and most preferably less than 30°. For the hydrophobic substrate surfaces according to the invention, the preferred contact angle between the liquid connecting material and the connecting surfaces (contact surfaces) is in particular greater than 90°, preferably greater than 125°, even more preferably greater than 150°, and most preferably greater than 175°.

Should it be necessary to convert a hydrophobic substrate surface into a hydrophilic substrate surface (or a hydrophilic substrate surface into a hydrophobic substrate surface), this can be performed with the known technique before performing the process according to the invention.

Plasma treatments, surface etchings, chemical treatments, coatings, sputtering, increasing surface roughness, etc., would be conceivable.

Hereinafter, the two substrate surfaces are assumed to be hydrophilic (preferred embodiment).

In order to ensure the distribution of the liquid and primarily the optimal wetting of the connecting surfaces, the surface of the substrates is preferably hydrophilic. If the deposition/application of a drop is carried out in particular on the upper/second substrate, a hydrophobicity that is too high (i.e., a hydrophilicity that is too low) can have a disadvantageous effect on the adhesive behavior between the liquid and the substrate surface. The hydrophilicity (i.e., the adhesive force) between the liquid and the substrate surface is preferably at least so high that the liquid is not drawn from the substrate surface by the gravitational force. In this case, a hydrophilicity is therefore selected in which the contact angle is at least larger than 0, in particular larger than 10°, and preferably larger than 20°.

Another physical parameter that is relevant according to the invention is the adhesion between the connecting layer and the substrates. The adhesion is preferably defined by the energy per unit of surface area, which is necessary in order to separate from one another two surfaces that are connected to one another. In this case, the energy is indicated in $J/m^2$. The connecting layer and the substrates are selected in particular in such a way that the energy per unit of surface area is less than 2.5 $J/m^2$, preferably less than 0.1 $J/m^2$, more preferably less than 0.01 $J/m^2$, most preferably less than 0.001 $J/m^2$, with utmost preference less than 0.0001 $J/m^2$, and most preferably less than 0.00001 $J/m^2$. A preferred, in particular empirically determined, mean of the energy per unit of surface area between a coating material, applied in particular on at least one of the substrates, and a polymer as connecting material lies at approximately 0.1 J/m$^2$. A typical, empirically measured mean of the energy per unit of surface area, between pure silicon and the same polymer, lies at approximately 1.2 J/m$^2$. Corresponding values can fluctuate depending on coating material, substrate material and contamination, in this case a polymer. In the future, much more efficient coating materials can also be expected.

In a special embodiment according to the invention, the connecting surfaces, in particular in front of a coating of the surfaces according to the invention, can be treated and/or can be coated with a plasma in order to change or to specially set the surface properties, in particular the hydrophilicity or hydrophobicity.

The usable types of plasma are preferably
Inductive plasma
Capacitive plasma
Remote plasma The contact angle or the desired adhesion is set by the selection of the parameters of the plasma.

According to an advantageous embodiment of the invention, the method is performed by the deposition of the exact amount of liquid of the connecting material and/or by the knowledge of the density, the viscosity and/or the surface properties of the connecting material in such a way that the liquid does not leave the peripheral edge of the two substrates. It is thus prevented that the unit in which the process according to the invention is performed is contaminated by the liquid.

According to a preferred embodiment according to the invention, the connection of the two substrates is carried out via the collection of the connecting material applied on the lower/first substrate with the connecting material applied on the upper/second substrate, in particular in the form of a droplet. The droplet in this case can be deposited by, for example, a unit for depositing liquids against the direction of gravity, as it is described in the publication DE102013113241.3. The droplet can in particular also be applied manually. This embodiment according to the invention is especially preferred since the droplet at the connecting surface (contact surface) of the second, upper substrate has a perfect convex shape because of gravitation acting on the droplet. In contrast to this, the liquid on the connecting surface of the first, lower substrate can have concave areas, in particular when it was poorly deposited. The concave areas primarily, but not exclusively, are produced by a "repeated deposition" of liquid on different, in particular non-centric, positions of the first lower substrate. Because these "repeated depositions" can be minimized to a large extent by correspondingly correctly calibrated depositing units, the embodiments of concave areas that take place in the submillimeter or submicrometer range are the ones of primary importance. It happens that the liquid surface forms local, very small (barely visible to the naked eye) concave areas by local surface tension changes (for example, by fat particles, dust particles, ions, organic molecules, etc.), which areas can act as germinal points for the formation of defects or bubbles. Independently of the cause for the forming of an imperfect convex liquid surface, this embodiment of the process can prevent flaws from forming. By virtue of this embodiment, the collection of droplets takes place at the connecting surface of the second, upper substrate with the liquid, having in particular concave areas, at the connecting surface of the first lower substrate. Because of the continuous, in particular slow, approach, enough time remains that defects, in particular gas inclusions, are pushed outside.

In another embodiment according to the invention, the liquid was deposited by a coating technique, in particular by centrifugal enameling or spray enameling, on the substrate surface of a substrate, in particular the lower/first substrate. In turn, the connecting material is applied as droplets on the substrate surface of the upper/second substrate.

In another embodiment according to the invention, the connecting material is applied on the lower/first substrate in the form of a pattern. In this case, the pattern is selected in such a way that in the case of the distribution of the connecting material according to the invention, an optimal, quick and primarily simultaneous wetting of the substrate surfaces is carried out. This type of distribution is preferred in particular for non-circular, in particular rectangular, substrates, since the length of the path, which the connecting material covers from the center to the edge, depends on the direction. Therefore, a deposition of the connecting material, matched to the geometry of the substrate, in particular on the lower/first substrate, is advantageous. On the upper/second substrate, in this case in particular a droplet of the connecting material is to be deposited in order to promote the contact according to the invention.

In a special embodiment, it is conceivable according to the invention to deposit/apply geometric figures, in particular one (or several, preferably crossed) rectangle(s) instead of a droplet and/or a puddle. In this connection, the distribution process of the liquid according to the invention is accelerated between the two substrates because of the better predistribution and the thus increased capillary action.

Because of the specifically deposited geometric figures, the liquid was already predistributed over a long distance (for example: line) or several longer distances (for example: cross). The deposited geometric figures preferably accelerate the liquid wave that is caused and promoted by the capillary forces, so that the distribution process of the liquid according to the invention is completed more quickly.

In another, especially preferred, embodiment according to the invention, the dispensing of the liquid to the lower/first substrate is eliminated. Only a dispensing of an, in particular individual, droplet on the connecting surface/contact surface of the second/upper substrate is carried out. Especially for the production of extremely thin liquid layers, the amount of liquid of the one droplet on the connecting surface of the second upper substrate is preferred according to the invention. The gravitation on the droplet acts by the dispensing of the droplet on the connecting surface of the second, upper substrate, so that this droplet has a perfect concave shape and does not have any concave areas. The point-like contact of the droplet with the connecting surface of the first, lower substrate is correspondingly exact. In the case of this embodiment, it must be dispensed only once, by which time and expense are saved.

The distribution according to the invention of the liquid connecting material (liquid) at room temperature is the preferred embodiment of the invention. Alternatively, the tempering of the first and/or second substrate is conceivable according to the invention. By the tempering of the first and/or second substrate, the viscosity of the liquid can be set specifically, and thus the flowing behavior can be regulated. The first/upper substrate and/or the second/lower substrate is/are in this case tempered depending upon the desired viscosity of the liquid. In this case, the temperature range according to the invention is in particular between −100° C. and 300° C., preferably between −50° C. and 300° C., even more preferably between 0° C. and 300° C., most preferably between 50° C. and 300° C., and even more preferably between 100° C. and 300° C. In particular, still no permanent cross-linking of the liquid takes place in the temperature range of the tempering of the first and/or second substrate.

The connecting material that is to be distributed between the two substrates according to the process of the invention is preferably hardened (cured), in particular during and/or after the distribution of the connecting material between the substrates. The hardening is done either using electromagnetic radiation and/or by means of heat. The electromagnetic radiation in this case has in particular a wavelength in the range of between 10 nm and 2,000 nm, preferably between 10 nm and 1,500 nm, more preferably between 10 am and 1,000 nm, with utmost preference between 10 nm and 750 nm, and with utmost preference between 10 nm and 500 nm.

In the case of thermal hardening, the liquid is heated to a temperature of higher than 100° C., preferably higher than 200° C., even more preferably higher than 300° C., most preferably higher than 400° C., and with utmost preference higher than 500° C. In this embodiment, the heat conductivity of the substrates is preferably the highest possible in order to convey the heat quickly and efficiently to the connecting material. The heat conductivity at least of one of the two substrates is preferably between 0.1 W/(mK) and 5,000 W/(mK), preferably between 1 W/(mK) and 2,500 W/(mK), even more preferably between 10 W/(mK) and 1,000 W/(mK), and most preferably between 100 W/(mK) and 450 W/(mK).

In an especially preferred embodiment, the deposition of the liquid against gravitation is carried out by the production of a droplet, in particular held together by the surface tension, at the end of a deposition tube, in particular a needle, and the removal/transfer of this droplet by making contact with a substrate surface. The droplet size can be specified by the precise selection of the diameter of the outlet opening.

Other advantages, features and details of the invention follow from the description below of preferred embodiments as well as based on the drawings.

BRIEF DESCRIPTION OF THE DRAWINGS

In the figures, features that are the same or that have the same effect are identified with the same reference numbers.

DETAILED DESCRIPTION OF THE INVENTION

Figure 1A:
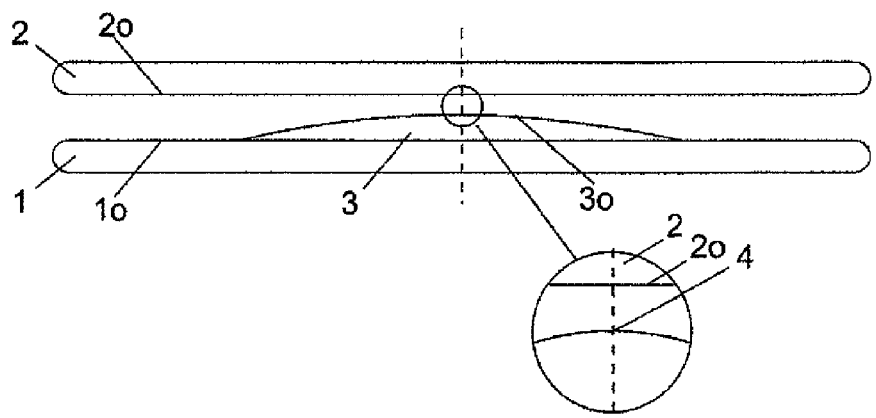
FIG. 1a is a diagrammatic cross-section, not to scale, of a first process step of a first embodiment according to the invention.

FIG. 1a shows the initial state of a first process step according to the invention under ideal conditions. A centrically deposited amount of liquid of a connecting material 3 with an ideal, convex liquid surface 3o is deposited on the connecting surface 1o of a first lower substrate 1o. A second upper substrate 2 is aligned with its connecting surface 2o opposite in the direction of the connecting material 3. Alignment is defined in particular as a wedge error compensation and/or an alignment relative to the peripheral contours 1u/2u of the substrates 1, 2 and/or alignment marks of the substrates 1, 2, not shown. The alignment of the substrates 1, 2 is done in particular by a corresponding alignment unit. A wedge error compensation can preferably be eliminated, however, since in the later process steps of the process according to the invention, an automatic wedge error compensation takes place.

Figure 1B:
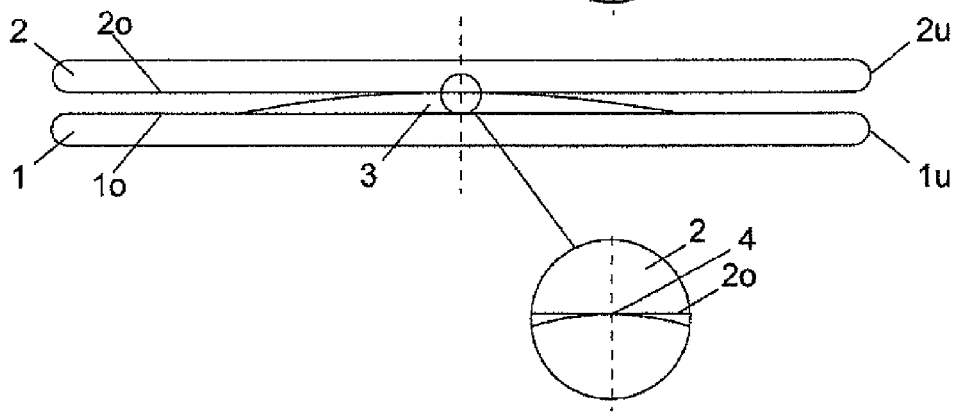
FIG. 1b is a diagrammatic cross-section, not to scale, of a second process step of the third embodiment.

In a second process step of the invention according to FIG. 1b, a relative approach of the two substrates 1 and 2 toward one another is carried out. In a first embodiment according to the invention, in which the second upper substrate 2 is held by a mechanism (not shown) on a corresponding second receiving device, an approach of the first, lower substrate 1 via a movement of a lower specimen holder (first receiving device) is preferred. It would also be conceivable, however, that the first, lower substrate 1 remains fixed on a lower specimen holder, and the upper, second substrate 2 is brought closer.

Figure 1C:
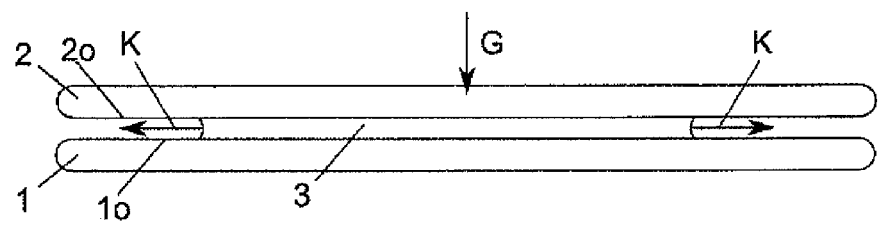
FIG. 1c is a diagrammatic cross-section, not to scale, of a third process step of the first embodiment.

When the connecting surface 2o of the upper substrate 2 makes contact with the liquid surface 3o in the contact point 4, the attachment of the upper substrate 2 is eliminated, and the gravitational force G that acts on the upper substrate 2 as well as an in particular lower capillary force K pulls together the two substrates 1 and 2 according to FIG. 1c. An oblique or even vertical storage of the two substrates 1 and 2 is less preferred, since as a result, the liquid could be distorted. By the continuous approach of the two substrates 1 and 2, the liquid is also simultaneously distributed between the substrates 1, 2; in particular, the distribution is supported or enhanced by the capillary action. In this process step according to the invention, a homogenization of the connecting material 3 and thus automatically also a wedge error compensation take place by the force of the weight and the capillary force acting together. With correspondingly precisely manufactured, geometrically equivalent substrates, even an automatic alignment of the two substrates to one another can occur.

Figure 1D:
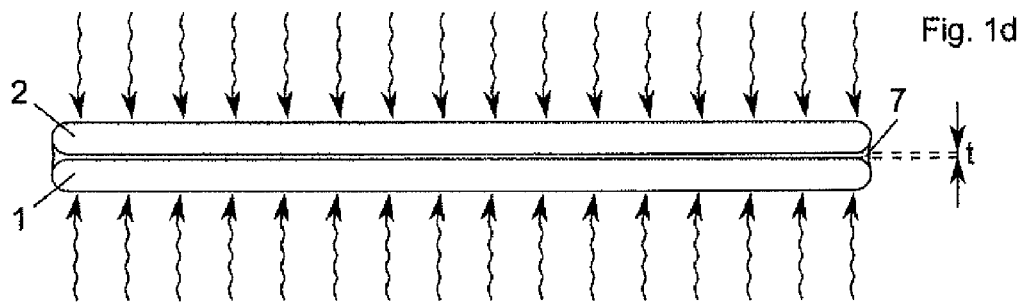
FIG. 1d is a diagrammatic cross-section, not to scale, of a fourth process step of the first embodiment.

In a last step of the invention according to FIG. 1d, which primarily is carried out with the use of hardenable liquids as connecting material 3, the first substrate 1 and/or the second substrate 2 and thus in particular also the connecting material 3 are exposed to electromagnetic radiation and/or heat. The exposure of the first substrate 1 and/or the second substrate 2 is symbolized in FIG. 1d by the arrows that point toward the two substrates 1 and 2.

Figure 2A:
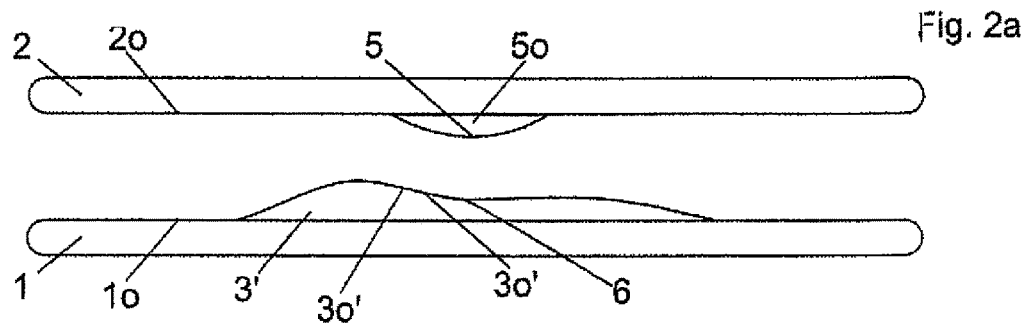
FIG. 2a is a diagrammatic cross-section, not to scale, of a first process step of a second embodiment according to the invention with an amount of liquid that is not optimally deposited.

FIG. 2a shows a more preferred embodiment according to the invention, in which a droplet is applied as connecting material 5 to the connecting surface 2o of the second substrate 2. The droplet 5 has a perfect convex droplet surface 5o based on the gravitational force that acts on it. The liquid 3' that is deposited in addition on the lower connecting surface 1o was deposited by an incorrect or poorly calibrated deposition system. The liquid surface 3o' thus does not have any perfect, purely convex liquid surface 3o'. This type of incorrect deposition primarily results from falsely calibrated, outdated or contaminated nozzles in the deposition system, not shown.

According to the invention, a deposition of several puddles/droplets distributed over the substrate surfaces 1o, 2o would also be conceivable, and said puddles/droplets then collect in the liquid 3' shown in FIG. 2a.

Figure 2B:
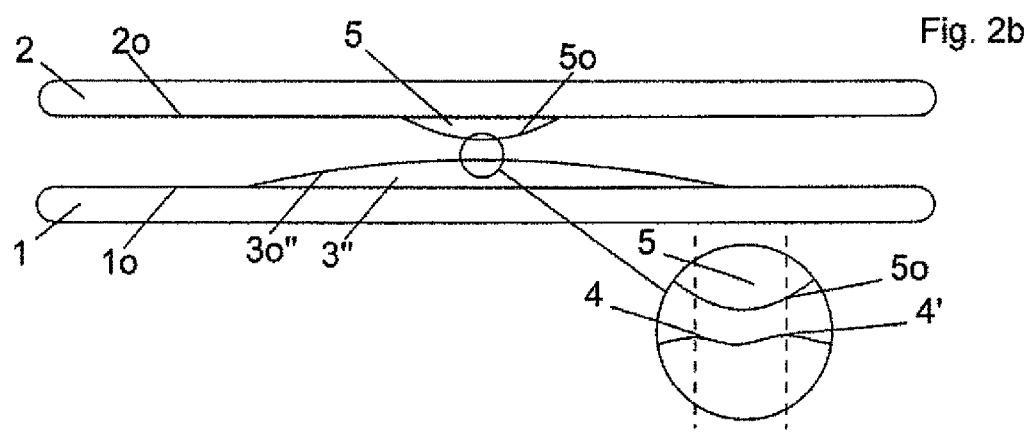
FIG. 2b is a diagrammatic cross-section, not to scale, of a first process step of the second embodiment according to the invention with an optimally deposited amount of liquid.

The extreme situation of the disadvantageously deposited liquid 3' on the connecting surface 1o of the lower substrate 1 in FIG. 2a is virtually absent in correctly calibrated and cleanly operating deposition systems. The formation of several local convex areas 4, 4' between which correspondingly concave areas 6 are located (FIG. 2b) would be very possibly conceivable, however. These areas 4, 4', 6 are primarily produced by particles in the millimeter, micrometer, and nanometer range, which can result in a change in the surface tension. If such a liquid surface were to make direct contact with an extremely flat substrate surface 2o, it would result in the formation of small bubbles in the millimeter range, micrometer range and nanometer range.

The second embodiment according to the invention can eliminate two problems by the deposition of a droplet 5 on the connecting surface 2o of the upper substrate 2. The deposition according to the invention of a droplet on the substrate surface 2o of the substrate 2 makes it possible in particular to bring into direct contact two liquids of the connecting material 3" with the droplet-like connecting material 5. As a result, potential bubbles that are produced during the contact still exit through fluid-dynamic relaxation processes from the boundary surface of the two connecting materials 3" and 5, and the collected resulting connecting material remains free of bubbles.

Figure 2C:
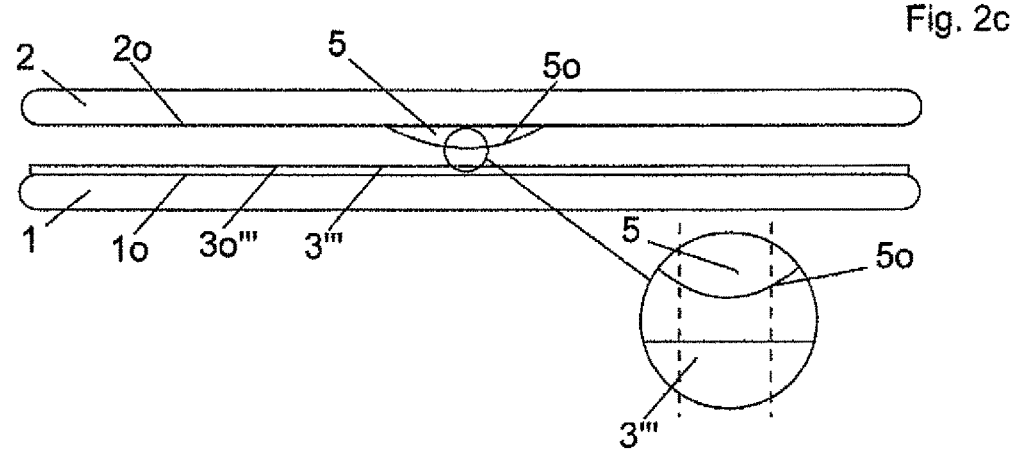
FIG. 2c is a diagrammatic cross-section, not to scale, of a first process step of the second embodiment according to the invention with an optimally distributed amount of liquid.

In another embodiment of the invention according to FIG. 2c, the liquid 3''' can be deposited by a coating method, in particular by centrifugal enameling or spray enameling, simultaneously over the substrate surface 1o of the substrate 1.

Figure 2D:
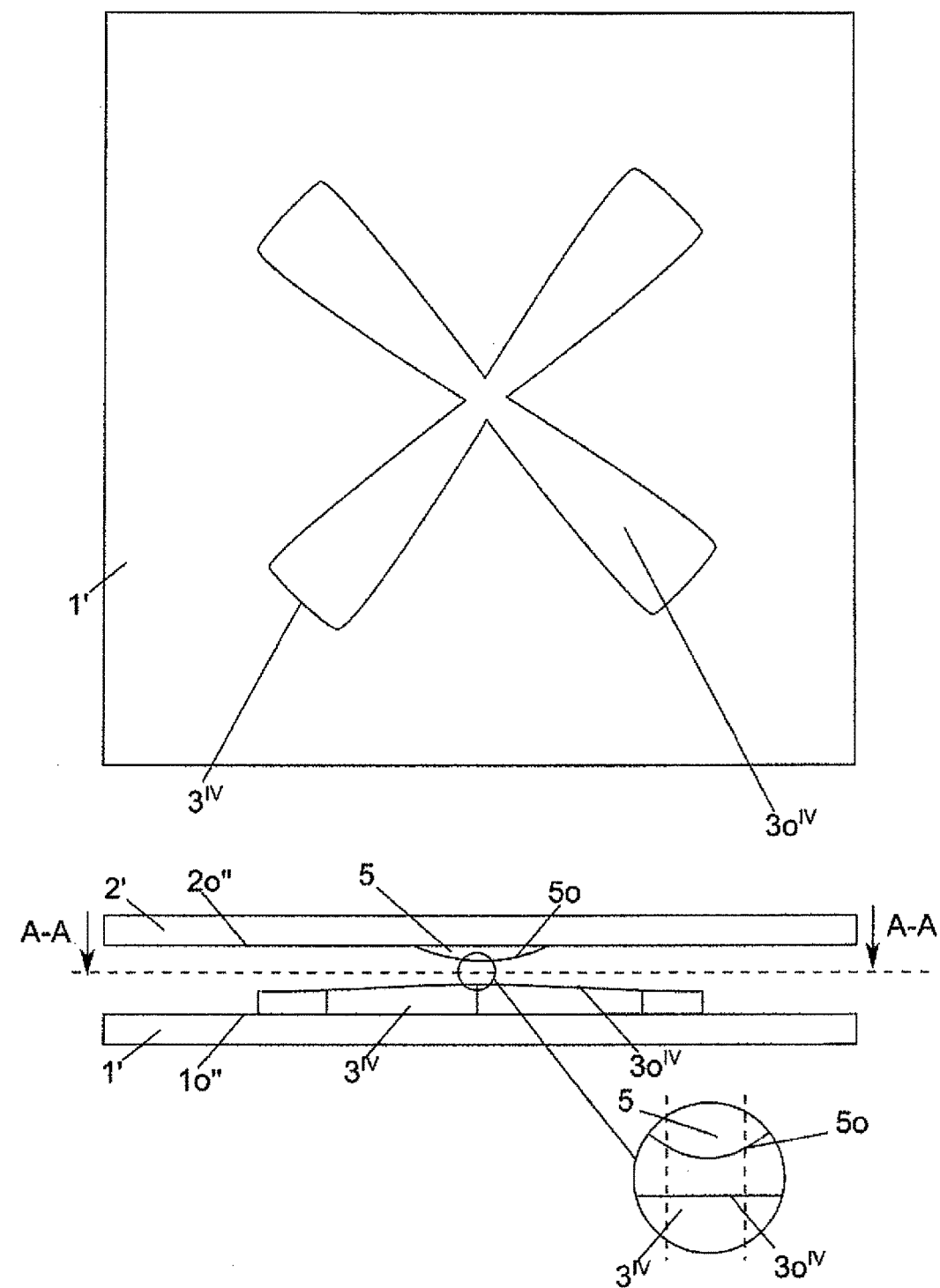
FIG. 2d is a diagrammatic cross-section, not to scale, as well as a corresponding top view of a first process step of the second embodiment according to the invention with a pattern that is produced.
Figure 3:
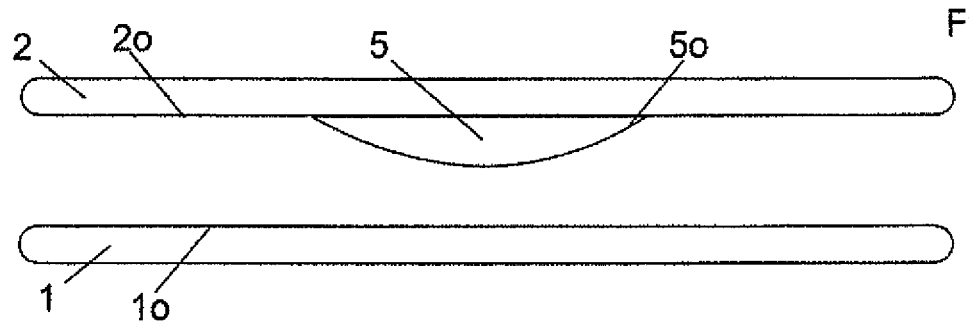
FIG. 3 is a diagrammatic cross-section, not to scale, of a first process step of a third embodiment according to the invention.

FIG. 2d shows another transverse view or top view, not to scale according to the invention, of two rectangular substrates 1', 2', on which a connecting material $3^{IV}$ was applied in the form of a pattern. After the connecting materials $3^{IV}$ and 5 are brought into contact, the pattern makes possible a faster, more efficient, more homogeneous and primarily simultaneous distribution of the collected connecting material between the two rectangular substrates 1' and 2'.

Then, an analogous procedure according to FIGS. 1c-1d is carried out.

In a quite especially preferred embodiment according to the invention, only a single droplet 5 is deposited on the connecting surface 2o of the upper substrate 2. Because of the gravitational force, the droplet 5 in turn has a purely convex shape. The amount of liquid of the droplet 5 is calculated in such a way that it is sufficient to produce the connecting layer 7 according to the invention between the two substrates 1 and 2.

After the droplet 5 is deposited, an analogous procedure of approaching, making contact, distributing and hardening is carried out in turn according to FIGS. 1c-1d.

Figure 4:
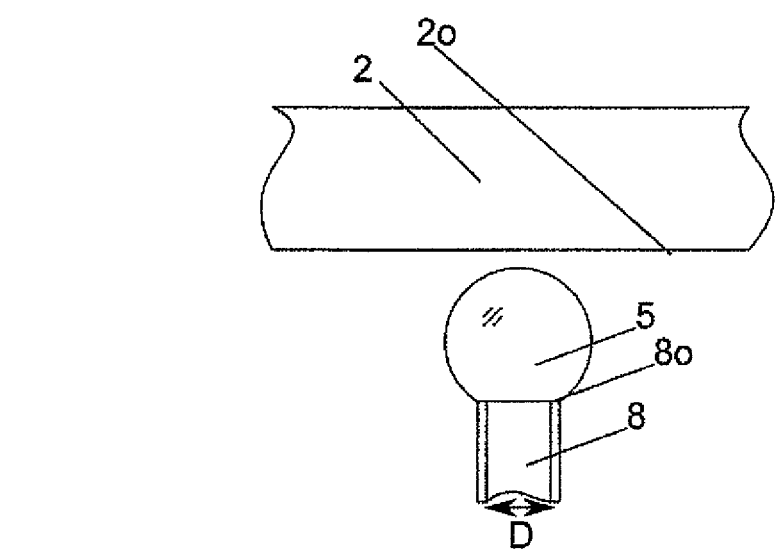
FIG. 4 is a diagrammatic cross-section, not to scale, of an embodiment according to the invention for droplet deposition.

FIG. 4 shows an especially preferred embodiment for deposition of the connecting material 5 in the form of a droplet on a substrate surface 2o. In this case, the droplet is produced by a deposition tube 8 on a deposition tube opening 8o. The surface tension of the connecting material holds the droplets together. After a droplet forms at the end of such a deposition tube 8, in particular a needle or a nozzle opening, a relative approach between the droplet 5 or the deposition tube opening 8o and the substrate 2 is carried out. Ultimately, the substrate 2 is based on the droplets and is transferred from the deposition tube opening 8o to the substrate surface 2o. According to the invention, a deposition tube diameter D is in particular smaller than 5 mm, preferably smaller than 2 mm, even more preferably smaller than 1 mm, most preferably smaller than 0.1 mm, and with the utmost preference smaller than 0.01 mm.

LIST OF REFERENCE SYMBOLS 1, 1' First substrate
1o, 1o' First connecting surface
1u Peripheral contour
2, 2' Second substrate
2o, 2o' Second connecting surface
2u Peripheral contour
3, 3', 3", 3''', $3^{IV}$ Connecting material
3o, 3o', 3o", 3o''', $3o^{IV}$ liquid surface
4, 4' Convex area
5 (Droplet-like) Connecting material
5o Droplet surface
6 Concave area
7 Connecting layer
8 Deposition tube
8o Deposition tube opening
t Thickness
G Gravitational force
K Capillary force
D Deposition tube diameter Having described the invention, the following is claimed:

1. A method for bonding a lower substrate with an upper substrate by means of a connecting layer arranged between the lower substrate and the upper substrate, the connecting layer formed of a connecting material, wherein the method comprises:

holding the lower substrate to a first receiving device;
holding the upper substrate to a second receiving device;
depositing the connecting material in liquid form to the lower substrate or the upper substrate by a centrifugal coating method or a spray coating method to form a coating of the connecting material thereon, said coating being distributed relatively uniformly on the lower substrate or the upper substrate;
distributing the connecting material between the lower substrate and the upper substrate by bringing the lower and upper substrates closer to each other, wherein the distributing takes place automatically by capillary action of the connecting material; and
releasing the lower substrate from the first receiving device and/or the upper substrate from the second receiving device after distributing the connecting material between the lower and upper substrates, thereby forming the shape of the connecting layer with a thickness t,
wherein an amount of the connecting material distributed between the lower and upper substrates is sufficient to form the connecting layer without excess connecting material overflowing a peripheral edge of at least one of the lower and upper substrates.

2. The method according to claim 1, wherein the amount of connecting material is preset by the thickness t of the connecting layer and a diameter of at least one of the lower and upper substrates.

3. The method according to claim 1, wherein the method further comprises applying at least one droplet of the connecting material in liquid form to the lower substrate or the upper substrate before distributing the connecting material between the lower and upper substrates.

4. The method according to claim 1, wherein the distributing of the connecting material between the lower and upper substrates and/or the bringing of the lower and upper substrates closer to each other is/are done at least partially by a capillary force of the liquid connecting material and/or by a gravitational force G acting on one of the lower and upper substrates.

5. The method according to claim 3, wherein the method further comprises:
   applying a coating to a connecting surface of at least one of the lower and upper substrates and/or treating the connecting surface of at least one of the lower and upper substrates with a plasma before applying the at least one droplet of the connecting material to the lower subtrate or the upper substrate.

6. The method according to claim 1, wherein the method further comprises:
   hardening the connecting material provided on the lower and upper substrates during and/or after the distributing of the connecting material between the lower and upper substrates and the bringing of the lower and upper substrates closer to each other.

\* \* \* \* \*